United States Patent [19]

Lipp

[11] Patent Number: 5,347,177
[45] Date of Patent: Sep. 13, 1994

[54] SYSTEM FOR INTERCONNECTING VLSI CIRCUITS WITH TRANSMISSION LINE CHARACTERISTICS

[76] Inventor: Robert J. Lipp, 15881 Rose Ave., Los Gatos, Calif. 95030

[21] Appl. No.: 4,364

[22] Filed: Jan. 14, 1993

[51] Int. Cl.$^5$ ............... H03K 17/16; H03K 19/0175
[52] U.S. Cl. ................... 307/443; 307/475; 307/451; 307/270
[58] Field of Search ............. 307/270, 443, 475, 451

[56] References Cited

U.S. PATENT DOCUMENTS

| | | | |
|---|---|---|---|
| 4,414,480 | 11/1983 | Zasio | 307/443 |
| 4,450,370 | 5/1984 | Davis | 307/475 |
| 4,703,198 | 10/1987 | Porter | 307/443 |
| 4,719,369 | 1/1988 | Asano | 307/465 |
| 4,774,422 | 9/1988 | Donaldson | 307/443 |
| 4,859,977 | 8/1989 | Cooperman et al. | 307/443 |
| 4,943,739 | 7/1990 | Slaughter | 307/443 |
| 5,003,205 | 3/1991 | Kohda | 307/475 |
| 5,023,488 | 6/1991 | Gunning | 307/475 |
| 5,134,311 | 7/1992 | Biber | 307/443 |
| 5,153,450 | 10/1992 | Reutz | 307/443 |

*Primary Examiner*—Edward P. Westin
*Assistant Examiner*—Andrew Sanders
*Attorney, Agent, or Firm*—Skjerven, Morrill, MacPherson, Franklin & Friel

[57] ABSTRACT

This invention provides a means to interconnect high performance CMOS VLSI circuits. LTL (a coined descriptor for describing a novel CMOS interface standard) offers improved performance by providing active threshold control of an input buffer to speed signal capture, and by controlling performance limiting characteristics of signal reflection, ground bounce, receiver overdriving and ringing. These performance limiting characteristics are controlled by providing: level-sensitive impedance control of an output driver, distributed active line termination using impedances of input buffers on a transmission line, and balanced loading using closed-loop transmission lines.

47 Claims, 7 Drawing Sheets

SYSTEM FOR INTERCONNECTING VLSI CIRCUITS WITH TRANSMISSION LINE CHARACTERISTICS

BACKGROUND OF THE INVENTION

1. Field of the Invention

This invention relates to integrated circuit (IC) drivers, receivers and their interconnection lines; in particular, this invention relates to VLSI (very large scale integrated) CMOS circuits operating at conventional supply voltage, e.g. 3.3 V, and their interconnections having characteristics of transmission lines.

2. Discussion of the related Art

Complex computer systems are often formed by numerous interconnected VLSI circuits. At very high switching rates, the signal lines interconnecting these VLSI circuits behave as transmission lines. That is, the "edge rate" (or "rise time") of a signal in such an interconnection line is shorter than the signal transit time through the interconnection line. To achieve such a high switching rate, a special driver, which can switch a large current very rapidly, is often used to generate a fast signal. However, in a typical IC package, a pin's relatively large inductance limits how fast a current in that pin can change, and thus limits the switching rate of the signal on the pin. Because of this inductance, an electrical noise, commonly referred to as a "ground bounce," can be generated in the signal whenever a driver on the pin turns on or off rapidly. This inductance may also cause signal ringing in concert with the load capacitance and low driver impedance.

It is known that a fast signal edge driven in an unterminated transmission line can result in a reflection at an end of the transmission line, resulting in a possible overdriving of the receiver circuitry at such end of the transmission line. This reflection is propagated back toward the driver, resulting also in a possible overdrive of the driver circuitry, as well as causing problems at other receivers and drivers along the transmission line. Such overdriving of both the driver and the receiver circuits on a transmission line may cause electrical failure or even physical damage in some cases. Commonly, the reflected signal is also reflected from the driver end towards the receiver end. Thus, reflections are present at both ends of the transmission line. These multiple signal reflections, as they continue to propagate back and forth along the transmission line, prevents the signal from stabilizing at its final value for an extended period of time. An excessive delay in achieving the final signal value may cause the system to fail. To ensure proper system operation, the system's performance is often lowered to accommodate such delay.

In the prior art, to minimize or eliminate the signal reflections discussed above, termination resistors are commonly used. In conventional CMOS circuits, series termination at the driver's output terminal has not proven to be generally practical. This is because, when an external termination is used, the driver impedance is required to have an impractically low value. However, when self-termination (i.e. where the impedance of the driver is the series terminating resistor) is used, inherent process variations in the manufacturing of CMOS circuits very often renders the impedance in the resulting driver to be too high at worst case operating conditions, or too low at best case operating conditions, or both.

Another method used in the prior art to minimize signal reflections is called "parallel termination", which terminates a transmission line at both ends with resistors connected to a terminating voltage. These resistors are each typically chosen to have a resistance equal to the line's characteristic impedance ($Z_0$), which is, for example, 50–70 ohms in a printed circuit board transmission line. Thus, when operating at typical power supply levels (e.g. 5.0 volts or 3.3 volts), parallel termination used in conventional CMOS or TTL signals consumes significant power and requires very large IC drivers. Additionally, such parallel termination reduces the voltage swing of the signal on the transmission line, thereby reducing the speed at which the signal can be effectively sensed by an input buffer or receiver. For these reasons, termination by resistors is rarely used in the prior art for CMOS and TTL circuitries.

In the prior art, "low swing" methods, such as providing transceivers using either emitter coupled logic (ECL) or GTL (a descriptor coined by Gunning, below), have used proposed. GTL is described in U.S. Pat. No. 5,023,488 to Gunning. These methods offer certain advantages but also have their disadvantages. For example, while GTL offers a low voltage swing and is applicable to CMOS circuitry, ECL is not readily applicable to CMOS circuitry. However, GTL suffers from (i) a potentially serious problem of signal ringing when the driver transistor turns off; (ii) a noise-sensitive low voltage signal swing, which is difficult and slow to translate to the IC operating voltage in the receiver, thus requiring the use of a special power supply and voltage reference; and (iii) incompatibility with existing interface standards, hence limiting its applicability and use.

FIG. 1 illustrates a connection scheme used in the prior art to connect transceivers to a signal bus. In FIG. 1, multiple transceivers, each consisting of a driver (indicated by one of drivers 13a–13h) and a receiver (indicated by the corresponding one of receivers 12a–12h) are connected to signal bus 14. Signal bus 14 is parallel terminated at each end by resistors 15 and 15a to a reference voltage 10, which is typically set at 50% of the operating supply voltage.

Proper termination of signal bus 14 requires matching each of the resistors' impedances to the impedance of signal bus 14. In practice, the effective line impedance can be considerably lower than the characteristic 50 ohms, due to the capacitances of the transceivers connected to signal bus 14. If drivers 13a–13h are driving intermediate points a distance from the ends of the bus, and the signal bus is parallel terminated at both ends with two 50 ohm resistors, each driver ideally would be designed to have an impedance of 25 ohms. Under this scheme, the voltage swing of the signal on the signal bus would range between 25% to 75% of supply voltage (i.e. 0.825 v to 2.475 v on a circuit operating from 3.3 v supply voltage). Signal swing is therefore only one half of the supply voltage (i.e 1.65 v on a circuit operating from a 3.3 v supply voltage). In a high performance system, the receiver is typically designed to recognize a valid signal change after 50% of the signal transition, i.e. the input threshold voltage should be set at 50% of the supply voltage, e.g 1.65 v in a circuit operating from 3.3 v supply voltage. Thus, ideally, in such a system, the noise margin, which is defined as the driver output voltage level minus the receiver input threshold level, is then one quarter of the supply voltage (i.e. +/−825 mv in a circuit operating from a 3.3 v supply voltage).

The factors which affect driver strengths and receiver sensitivities, i.e. the normal variations in the manufacturing process, the ambient operating conditions of the circuit, and the operating voltage, reduce the actual effective operating voltage or signal swing available in the scheme shown in FIG. 1 to considerably less than one half the supply voltage. Such a low effective signal swing considerably reduces noise margins and decreases input receiver performance. Significantly also, the scheme shown in FIG. 1 does not provide TTL-compatible voltage levels.

In addition, the power dissipation in FIG. 1's signal bus 14 is high. Current in signal bus 14 is equal to the reference voltage ($V_{ref}$) divided by the net impedance through the resistors 15 and 15a and the driver driving signal bus 14 at the time. Thus, assuming a 50-ohm transmission line and a 3.3 v supply, the current in signal bus 14 is 66 ma with a DC power dissipation of 218 mw. Power dissipated in the driver is 50% of the total, or 109 mw. If signal bus 14 is a 32-bit bus, the total power dissipation in the driver circuits is as high as $32 \times 109$ mw=3.5 w. Even allowing for a lower average operating duty cycle, the power dissipation in the termination scheme illustrated by signal bus 14 is unacceptable in most applications.

Thus, few CMOS and TTL systems use such parallel resistor terminated lines because of the DC power dissipation. FIG. 2 shows a similar approach, which is more frequently used in CMOS and TTL circuits. To simplify comparison, elements in FIG. 2 which correspond to like elements of FIG. 1 are provided like reference numerals. Unlike FIG. 1, however, signal bus 14 is not terminated by resistors. Instead, signal bus 14 is provided at the ends diodes 17–18 and diodes 17a–18a to clamp the voltages at each end of the transmission line to the supply (16) and ground (19) voltages. With the termination resistors 15 and 15a eliminated, the signal on signal bus 14 reflects from the ends of the signal bus 14. U.S. Pat. No. 4,414,480 to Zasio discloses the use of signal reflections to generate the full swing signals needed to properly switch conventional input buffers. In Zasio's approach, which uses 25-ohm drivers on a 50-ohm line, the initial output signal at an output driver is ideally 50% of supply voltage, or 1.65 v. This initial output signal is then reflected from the far ends of the transmission line to create the final full swing signal.

Thus, the "worst case" total time required to achieve a valid signal level is the complete round trip travel time of the signal from one end of the transmission line to the other and back again. Consequently, the maximum ("worst case") driver impedance to achieve a valid signal is about 50% of the characteristic impedance of the signal line.

In a conventional CMOS process, the minimum ("best case") impedance is in the range of 10% to 15% of the characteristic line impedance. Thus, under "best case" conditions, the initial output signal at the output driver is considerably larger than 50% of the supply voltage. Upon reflection from the ends of the transmission line, the reflected signal is doubled to a value considerably more than the supply voltage. This high voltage not only consumes extra power, but, when sufficiently large, may cause spurious operation (e.g. "latchup") and physically damage the receiver input terminals. To limit such excessive voltages, a transmission line is commonly terminated with diode clamps 17–18 and 17a–18a to the power supply 16 and ground voltage 19. Diodes 17, 17a, 18 and 18a limit signal voltage excursions to within a safe range, but does not reduce power dissipation.

In some applications, the drivers are specifically designed with a very low impedance to guarantee switching on the "incident wave" i.e. before signal reflections occur. Incident wave switching eliminates the need and therefore the time required for the reflected signal to return from the transmission line end. However, the very low impedance required of the driver under incident wave switching is usually impractical in CMOS circuits, thereby limiting the use of incident wave switching to very few CMOS circuits. Furthermore, power dissipation with incident wave switching is high and the attendant low buffer impedance requirement tends to cause undesirable signal ringing. In fact, the time required for a ringing signal to stabilize is often longer than the time saved in driving the transmission line with the "incident wave".

Another technique, described in U.S. Pat. No. 4,450,370 to Davis, replaces a terminating resistor, e.g. as terminating resistor 15 of FIG. 1, by a single active termination. An example of such an active termination is a tristate buffer.

It is desirable to have an interface standard for CMOS circuits. Such interface standard, together with associated circuits that are compatible with existing interface standards (e.g. TTL), is preferably extensible to operate at higher performance levels as needed. Additionally, it is desirable that this CMOS interface standard includes an improved practical transmission line connection and termination scheme, which controls both signal ringing and reflections at a reduced power dissipation requirement.

SUMMARY OF THE INVENTION

In accordance to the present invention, a circuit is provided which offers improved performance and is compatible, in its simplest form, with an existing interface standard (TTL). The present invention can be extended to offer further improved performance, at some expense to compatibility with the existing interface standards. Furthermore, the circuit of the present invention can be used in a common signal bus according to a novel interconnection method, which improves the reliability and predictability of system operation by equalizing the load characteristics of every transceiver connected to the common signal bus.

The present invention has several aspects which can be applied independently, as well as simultaneously, to achieve an optimized solution. In accordance with one aspect of the present invention, a driver with an actively controlled impedance provides (i) a minimum output signal level sufficient to operate in a "worst case" condition, characterized by minimum operating voltage, high temperature and values of manufacturing parameters skewed to yield slow circuits, and (ii) minimized signal overdriving in a "best case" operating condition, characterized by maximum operating voltage, low temperature, and values of manufacturing parameters skewed to yield fast circuits. During switching, in accordance with this aspect of the present invention, the impedance decreases until the optimum output signal voltage level is attained. As the signal further changes, the impedance is then increased. As switching completes, this changing impedance both limits the peak output current and turns off the driver in a controlled manner. Consequently, inductive signal bounce, signal ringing and signal reflections are reduced.

In accordance with another aspect of the present invention, input buffers (i.e. receivers) are provided integrated terminating resistors which are dynamically switched, such that these resistors are connected throughout the switching to the same supply level as the input signal, thereby eliminating DC power dissipation. When the terminating resistors in the receivers of the present invention are each provided a resistance equal to the product of the number of transceivers connected to the bus and the impedance of the transmission line, any overshoot caused by signal reflections at the ends of the transmission line is fully attenuated when the reflected signal returns to the driver. If the resistance is greater or lesser than that value, the signal overshoot travels correspondingly a greater or lesser distance before being fully attenuated. Consequently, the transmission line behaves in a manner opposite to a low-low-noise distributed impedance transmission line (commonly referred to as a "lossy" transmission line). That is, in accordance with this aspect of the present invention, the signal amplitude in the transmission line is restored to its initial value, rather than being attenuated as the signal propagates down the transmission line. In the present invention, low signal values are increased and signal overshoots are attenuated.

In accordance with another aspect of the present invention, the input buffer is provided with input threshold voltage level control. The input threshold voltage level is the voltage level which, when received at the input terminal of the receiver, causes a change in the output state of the receiver. According to the present invention, the input threshold voltage level is adjusted, synchronously with the clock, such that an input signal need only switch a small portion of the total voltage swing to reach the input threshold voltage level. For example, one embodiment of the present invention sets the input threshold voltage level closer to the current input state than the opposite state. An advantage of thus setting the input threshold voltage level improves system speed considerably, at some expense to compatibility with the TTL interface standard.

In accordance with another aspect of the present invention, a transmission line may be connected in a closed-loop fashion. In this manner, every output buffer or driver drives an identical load comprising two transmission lines in parallel. The signal returns to the driver only after traversing the entire loop in both directions, attenuated by terminating resistors placed along the transmission line. An advantage of such a closed-loop transmission line is a significantly reduced charge time of the load capacitances. This significantly reduced charge time results because the load capacitances are effectively being driven by a pair of transmission lines.

DETAILED DESCRIPTION OF THE INVENTION

Figure 1:
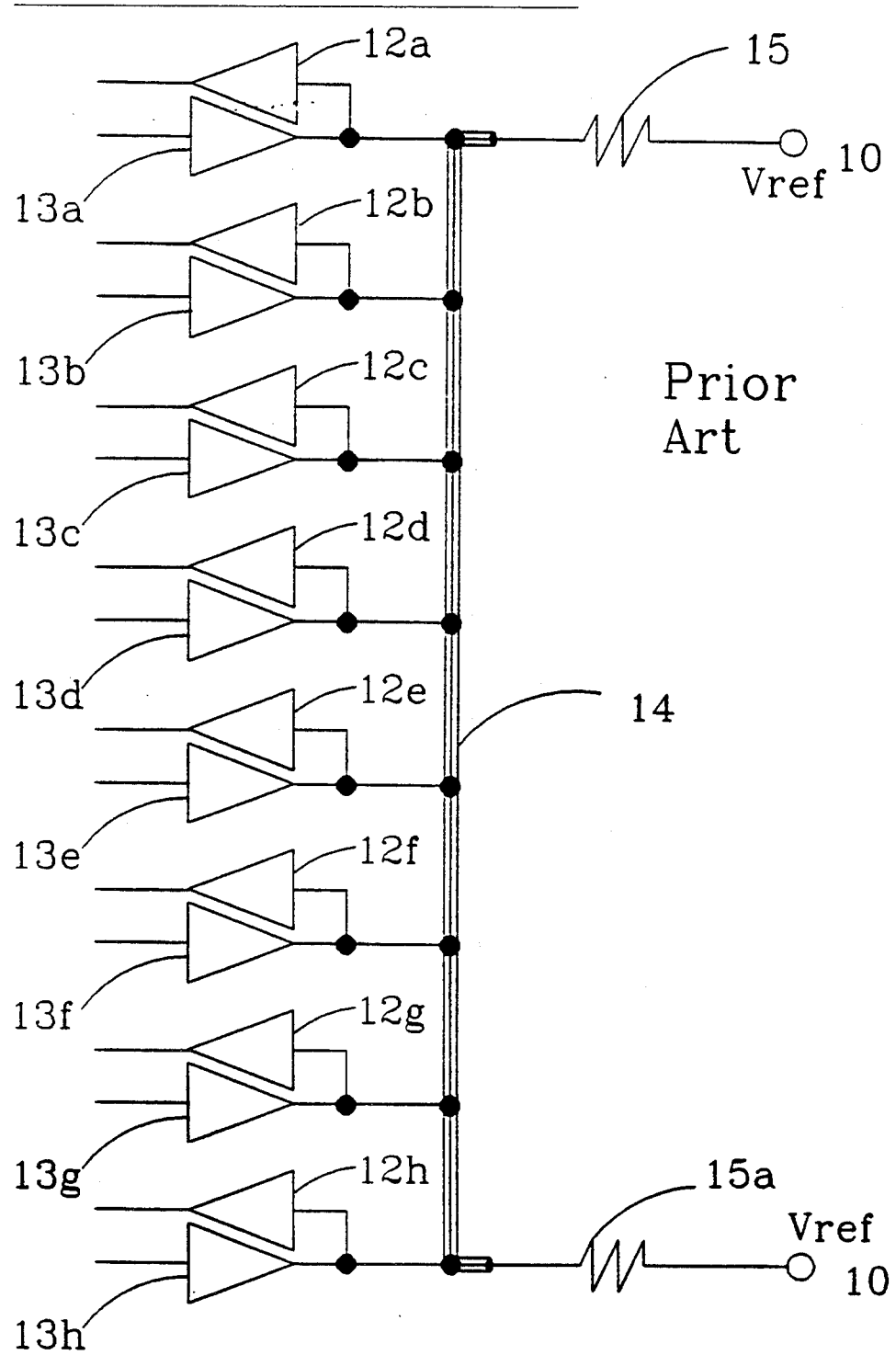
FIG. 1 is a block diagram of a typical system implementation in the prior art using resistor-terminated transmission lines.

Although the embodiments of the present invention described hereinbelow operate from a 3.3 V supply voltage, one of ordinary skill in the art will appreciate that the present invention is applicable to circuits using other supply voltages (e.g. supply voltage ranging 2.0 V-5.5 V).

In this detailed description and the accompanying drawings, to facilitate reference and to promote clarity, like components are provided like reference numerals throughout the drawings.

Figure 3:
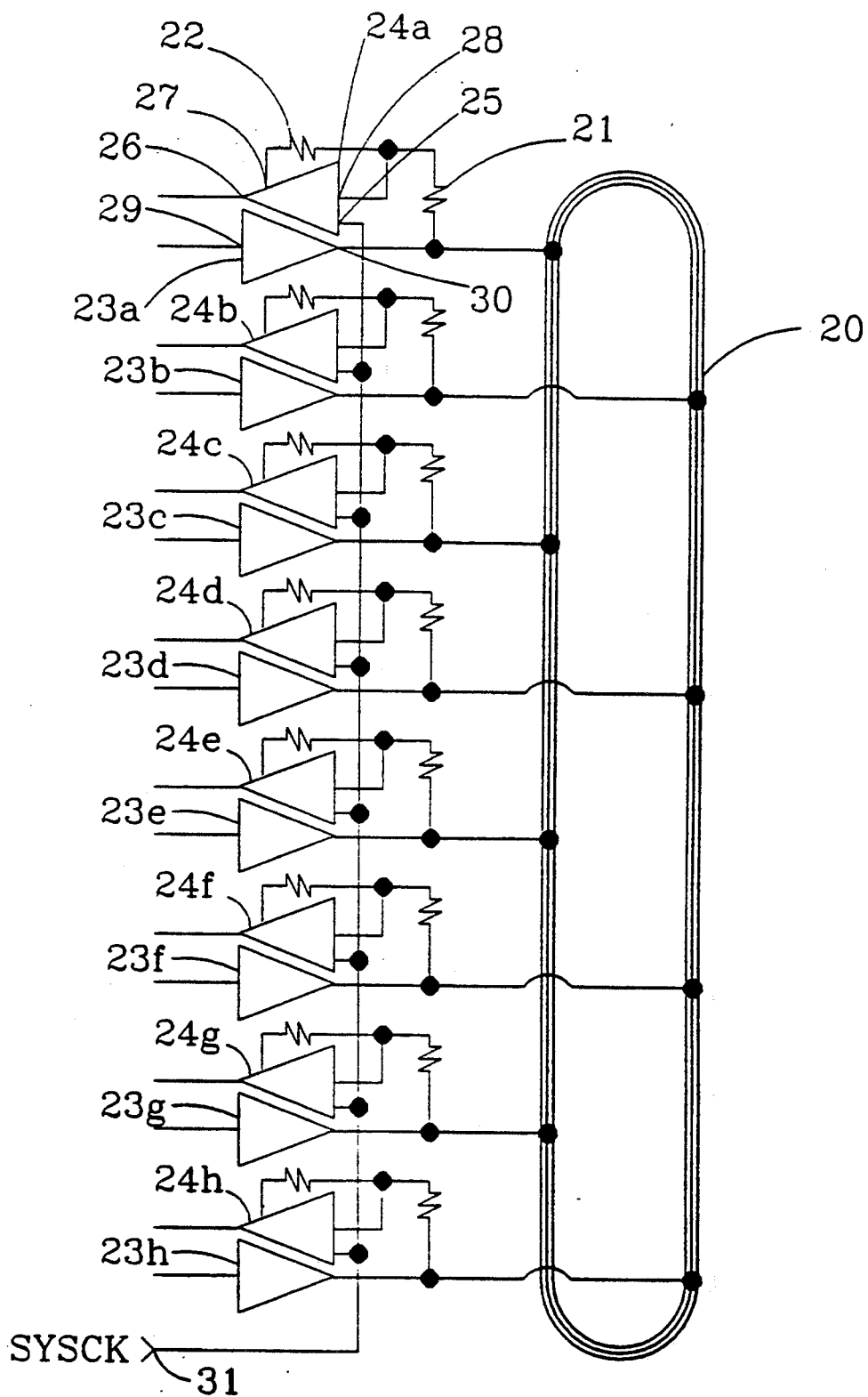
FIG. 3 is a block diagram of a typical system in accordance with the present invention.

FIG. 3 is a block diagram which illustrates the current invention. As shown in FIG. 3, output buffers ("LTL output buffers") or drivers 23a-23h, combined with input buffers ("LTL input buffers") or receivers 24a-24h, form eight transceivers driving a transmission line 20, which is connected end-to-end to form a closed loop. Each of the transceivers in FIG. 3 performs similar function as any of the transceivers in FIG. 1. Since drivers 23a-23h are identical to each other, and receivers 24a-24h are identical to each other, all references hereinbelow to "driver 23a" and "receiver 24a" are understood to be equally applicable to any of drivers 23a-23h and any of receivers 24a-24h, respectively. In one embodiment, each transceiver in FIG. 3 resides on a different IC. Although eight transceivers are illustrated in FIG. 3, any given system may have more or less transceivers.

As shown in FIG. 3, receiver 24a has a primary input 28 whose threshold level is controlled by a second input 25, which is connected to a system clock signal (designated "SYSCK") on lead 31. One of ordinary skill will appreciate that other synchronous signals can also be used. Input lead 28 is connected between resistors 21 and 22, which are respectively connected between input lead 28 of receiver 24a and transmission line 20, and between input lead 28 of receiver 24a and an in-phase output lead 27. Resistor 21 has a much lower resistance than resistor 22. Resistors 21 and 22 add a small hysteresis to the switching characteristics of receiver 24a, as well as providing both a distributed termination for transmission line 20 and a bus hold function. The primary output lead 26 of receiver 24a connects to other circuitry (not shown) on the IC. Driver 23a is connected on the IC to other circuitry (not shown), which provides an input signal at input lead 29. Driver 23a drives transmission line 20 on output lead 30. As described below, driver 23a is a specially designed driver with variable drive strength control. A conventional control scheme (not shown) is used to disable driver 23a, and to place driver 23a in a high-impedance state, when another driver is actively driving the transmission line.

Unlike the transmission lines of the prior art, transmission line 20 of FIG. 3 is a closed-loop transmission line. Thus, under ideal conditions, each driver on transmission line 20 drives an identical load. This load can be seen as a pair of transmission lines being driven at a center tap. By contrast, drivers 13a-13h of FIG. 1 each drive a different load, depending on its distance from the end of the transmission line. For example, in FIG. 1, drivers 13d and 13e in the center of the line 14 each drive a pair of transmission lines, while drivers 13a and 13h at each end of transmission line 14 are so close to the end that the transmission line 14 acts as a transmission line only in the direction towards the far end. Thus, drivers 13a and 13h each drive a load equivalent to a single transmission line. Consequently, an end driver, e.g. driver 13a, will therefore send a much larger signal pulse down the line than a center driver, e.g driver 13d, because the effective impedance seen by the end driver is twice the impedance seen by the center driver. One disadvantage of the prior art results from this position sensitivity, which makes it difficult to match the impedance of a driver to the impedance of the transmission line.

In the system shown in FIG. 3, only one half of the receiver loads are driven by each half loop of transmission line 20. Each driver in FIG. 3 is therefore seeing a load similar to that of drivers 13d or 13e of FIG. 1, where the driver is at the center of the transmission line, and where the capacitive load on each portion of the line is only 50% of the total load. Under the configuration of FIG. 3, the signal transit time in transmission line 20 is reduced considerably over the prior art. In a transmission line, the transit time t is given by $t=(LC)^{0.5}$, where L is the transmission line inductance, and C is the sum of the transmission line capacitance and the receiver input capacitance. Thus, by reducing the capacitance C by 50%, the transit time is considerably (i.e. approximately 30%) reduced. An added benefit, to be further described below, is achieved by the distributed termination of transmission line 20. Distributed termination of a transmission line is more effective in a closed-loop transmission line.

Unlike the fixed input buffers of the prior art which input threshold voltage levels are typically set at a nominal 50% of supply voltage, receiver 24a is provided a variable input threshold voltage level. In receiver 24a, the input threshold voltage level is shifted in the direction of the existing input voltage level. For example, when the input level is at logic low, the input threshold voltage level is adjusted to below 50% of supply voltage, e.g. 30% of supply voltage. That is, for a circuit operating from a 3.3 v supply voltage, the input threshold voltage level is adjusted from 1.65 v to 1.0 v. The adjustment of the input threshold voltage level to be closer to the existing input state has at least two advantages.

First, receiver 24a is provided a signal swing and a noise margin sufficient to unambiguously detect an incident wave voltage level of only 50% of supply voltage. Under this scheme, incident wave switching becomes practical in CMOS circuits. With incident wave amplitude set at 50% of supply, there is no danger that the incident wave causes a voltage overshooting that results in a hazardous signal of a magnitude greater than the supply voltage. Although closed-loop transmission lines do not have reflected waves, a similar voltage doubling occurs as the two incident waves travelling in opposite directions down transmission line 20 meet at the far side of the closed loop away from driver 24a.

The second advantage of a variable threshold voltage level is the improved switching speed resulting from driver 24a having only to deliver a smaller amount of charge in order to achieve the threshold voltage. This second advantage is particularly important if transmission line 20 has a large load lumped at a distance from driver 24a. For example, in the prior art, to ensure switching only on a valid noise-immune signal in a conventional receiver, the signal level is needs to be 70% of the supply voltage. By contrast, switching only on a valid noise-immune signal can be achieved in an LTL buffer at 50% of the supply voltage. To see the significance of this advantage, consider that the time to reach 70% of the supply voltage from ground voltage, as modelled by an RC time constant, is 1.2 RC. On the other hand, the time to reach 50 % supply voltage is only 0.7 RC, representing a reduced rise time of approximately 40%.

Figure 4:
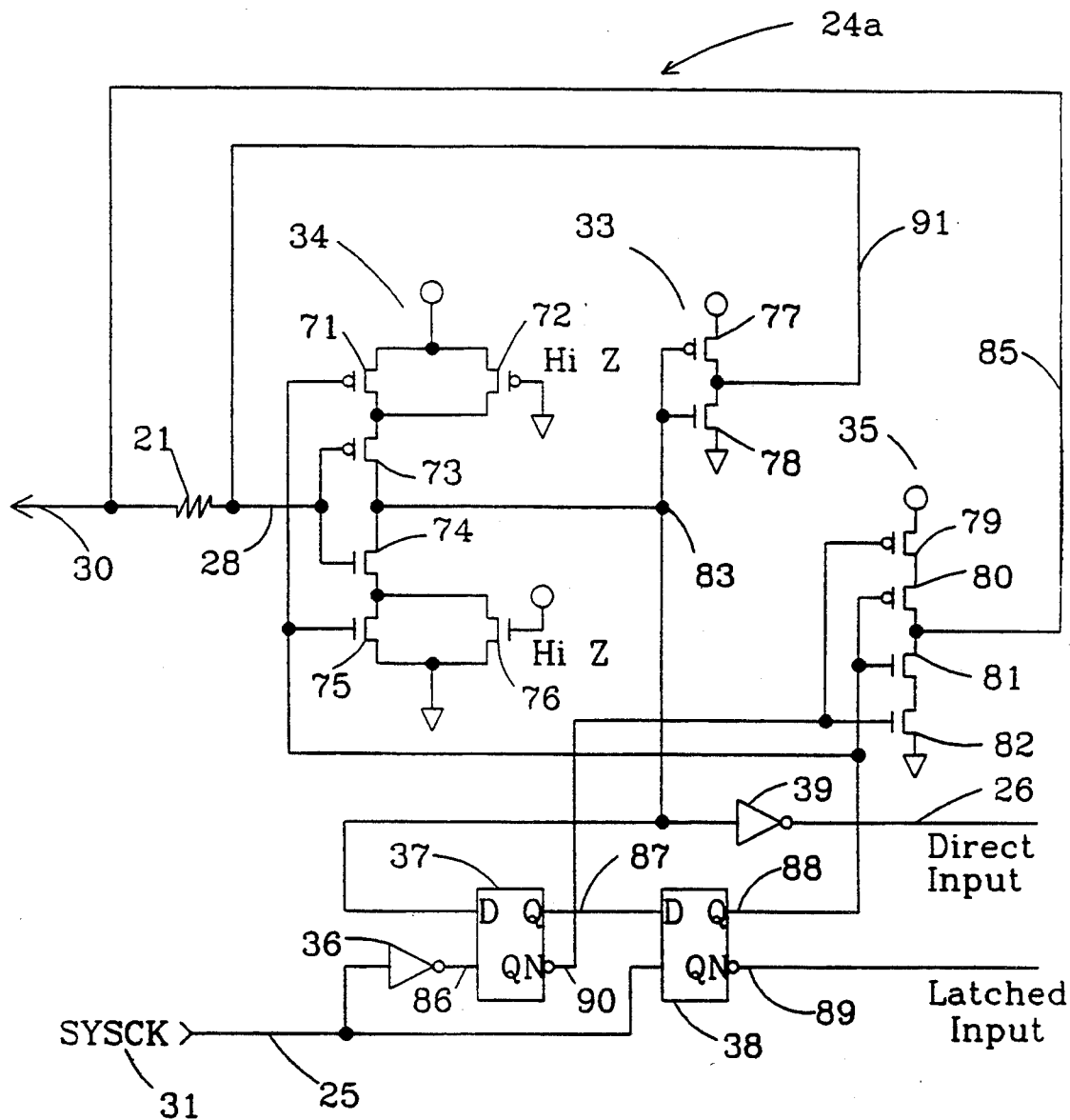
FIG. 4 is a schematic circuit for input buffer 24a and terminating resistor 21 of the present invention.

FIG. 4 is a circuit schematic showing LTL input buffer 24a and terminating resistor 21 of the present invention. Input buffer 24a comprises an input buffer stage 34, an output buffer stage 39, first and second control latches 37 and 38, a clock inverter 36, and first and second feedback buffer stages 33 and 35. In addition, resistor 21, which is shown as external to LTL receiver 24a in FIG. 3, is also shown in FIG. 4.

LTL receiver 24a receives an input signal on input lead 30, which is the common electrical node of terminating resistor 21, output buffer 23a and transmission line 20, as shown in FIG. 3. LTL receiver 24a provides two output signals: a signal on lead 26 which is a buffered copy of the signal on lead 30, and a signal on lead 89, which is a latched copy of the signal on lead 30 delayed until the beginning of the next clock cycle after the signal's arrival at lead 30.

CMOS transistors 73 and 74 act as an inverter and provide the input switching for input buffer stage 34. The switching threshold is determined by the ratio of (i) the effective gain of the connected p-channel transistors 71 and 72, to (ii) the effective gain of the connected n-channel transistors 75 and 76. As compared to transistors 71 and 75, transistors 72 and 76 are small, and therefore having higher impedance than transistors 71 and 75. Transistors 73 and 74, in turn, are relatively larger (i.e. having lower impedance) than transistors 71, 72, 75 and 76. The output signal of latch 38 on lead 88 controls transistors 71 and 75, such that only one of transistors 71 and 75 is conducting at any given time.

When the signal on lead 88 is at logic low, transistor 71 is "on" (i.e. conducting) and transistor 75 is "off" (i.e. non-conducting). Under this condition, the output impedance of receiver 24a to ground is primarily determined by transistor 76, while the output impedance to the power supply is determined by the combination of the parallel transistors 71 and 72, in series with transistor 73. This design raises the input threshold voltage level of receiver 24a to be closer to the supply voltage level than to ground voltage.

Alternatively, when the signal on lead 88 is at logic high, one of ordinary skill will appreciate that the input threshold voltage level of receiver 24a is analogously lowered to be closer to the ground voltage.

The signal on lead 88 has a logic state opposite to that of input signal 28. However, the signal on lead 88 is delayed by latches 37 and 38 by the SYSCK signal on lead 31. The SYSCK signal is received at input lead 25. After a logic state transition on lead 28, the signal on lead 88 does not change its logic state until after signal SYSCK cycles from logic low to logic high. This delay of the signal on lead 88 allows the input signal on lead 28 to fully switch and stabilize before the input threshold voltage level is adjusted. Without this delay circuitry, receiver 24a may oscillate.

Output buffer stage 39 is a conventional inverter or buffer driving into the IC. Output stage 33 is used to isolate the feedback signal on lead 91 from the logic signal on lead 26. The on-resistance of transistors 77 and 78 are each chosen to match the desired termination resistance 22 of FIG. 3, so that the function of resistor 22 is performed by inverter 33. Inverter 33 thus eliminates the need for a separate resistor 22. In other words, feedback inverter 33 provides the distributed termination of transmission line 20 of FIG. 3.

The positive resistive feedback path provided by lead 91 speeds up signal propagation and restores integrity to the propagating signal on transmission line 20. Each transceiver on transmission line 20 provides a low impedance capacitive discontinuity to transmission line 20 at the point where the transceiver is attached to transmission line 20. The positive feedback path on lead 91 reduces the effect of the discontinuity, thereby helping to complete the signal transition at the transceiver, to drive the propagating signal on transmission line 20 and to prevent an oscillation in the propagating signal.

Figure 2:
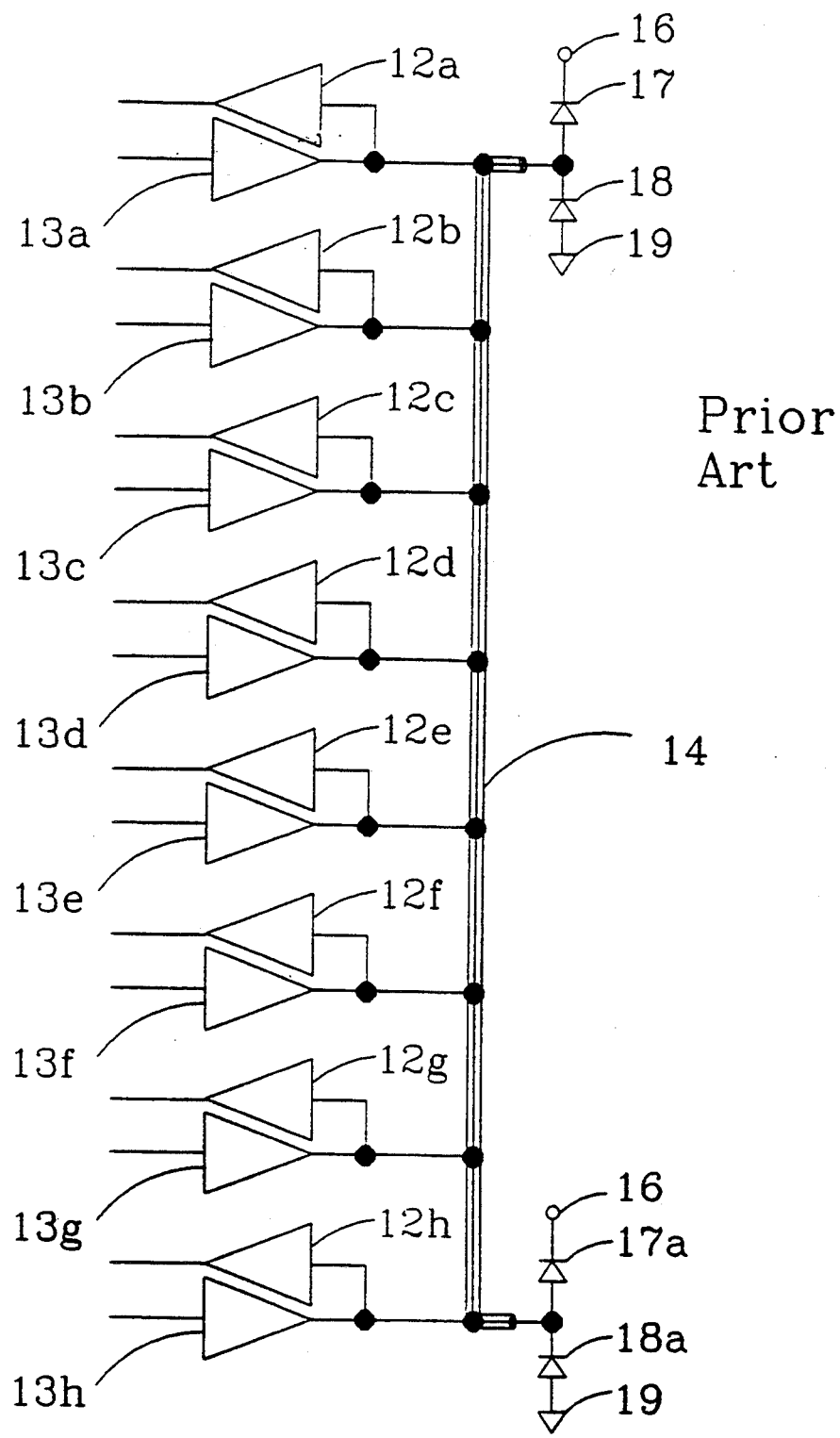
FIG. 2 is a block diagram of a typical system implementation in the prior art using diode-terminated transmission lines.

Another advantage due to the distributed termination of transmission line 20 by the impedances of transistors 77 and 78 is the gradual dampening of any signal overshoot, as the signal returns from propagating over closed-loop transmission line 20. The circuit for receiver 24a, as shown in FIG. 4, can similarly dampen any reflected waves, if used in a conventional transmission line, e.g. transmission line 14 of FIG. 2. When compared to the on-resistances of transistors 77 and 78, resistor 21 has a small resistance, so that resistor 21 adds a small hysteresis to the switching characteristics of receiver 24a.

In a high performance system, inverter 33 can be powered by intermediate voltage levels which are between the power and ground voltages. Means to provide such intermediate voltages is known in the prior art, and a detailed description of such means is therefore omitted. Using intermediate voltage levels for powering inverter 33 provides termination characteristics which are valuable in certain cases. First, when the drivers on transmission line 20 are not full-swing output buffers, the termination voltages (i.e. the voltages used to power inverter 33) can be set at the maximum and minimum output voltage levels of such a driver. For example, the CMOS output buffer transistors could be connected as source followers with the n-channel transistor providing pullup to power and the p-channel transistor pulldown to ground. The maximum and minimum voltages are the supply voltage less the n-channel transistor's threshold voltage, and the ground voltage plus the p-channel transistors threshold voltage respectively.

By limiting the voltage swing in the driver, the amounts of charge needed to bring the load capacitances to the respective input threshold voltage levels are reduced. In this manner, performance is enhanced and transient switching power is reduced. Alternatively, to enhance noise immunity, termination voltages can also be provided in excess of the output buffer signal swing, but at intermediate voltages between supply and ground voltages.

A driver of transmission line 20 can also be disabled before the end of a clock cycle in which it is active, such that, prior to the start of the next cycle, transmission line 20 remains at the termination voltage, rather than at the driver output voltage. By so reducing the voltage on transmission line 20 to be closer to the termination voltage (i.e. also closer to the input threshold voltage of receiver 24a), the voltage swing necessary to accomplish switching is reduced. In this manner, performance is further improved and signal overshoot and reflections are further reduced.

In some applications, it may be desirable to reduce the feedback impedance so as to more quickly attenuate signal reflections. Such reduced feedback impedance may be accomplished by providing in parallel copies of inverters similar to the inverter formed by resistors 77 and 78. However, if the resistances of transistors 77 and 78 are too small, such parallel combination of several of these resistances may create a resistance too low, thereby affecting the line driver's ability to reliably switch the input buffers. In such a case, transistors 77 and 78 can be designed as multiple parallel transistors or inverters, at least one of which can be disabled, or can be operated as a tristate feedback buffer.

Such a tristate feedback buffer is illustrated in FIG. 4 by tristate inverter 35. Inverter 35 operates in parallel with inverter 33. Unlike inverter 33, however, inverter 35 is connected to the other side of resistor 21, i.e. to lead 30, which connects directly to transmission line 20. So connected, inverter 35 provides a low impedance active feedback to transmission line 20, without affecting the input hysteresis level set by the ratio of inverter 33 and resistor 21. Inverter 35 comprises relatively low impedance transistors 79, 80, 81, and 82, which are controlled by the signals on leads 88 and 90. As shown in FIG. 4, the signals on leads 88 and 90 are the delayed and latched versions of the output signal on lead 83 of input buffer stage 34. Latches 37 and 38, which provide the signals on leads 90 and 88 respectively, are transparent (i.e. open) when the respective clock signals on leads 86 and 25 are high, and latched otherwise. When the signals on leads 88 and 90 are the same polarity, feedback tristate inverter 35 becomes active. The period of activity occurs after the clock signal SYSCK goes low, for any cycle when the signal on lead 83 switches polarity. During the first part of a clock cycle, i.e. when clock signal SYSCK is high, latch 37 is latched and latch 38 is transparent. Thus, during this part of the clock cycle, the signals on leads 88 and 90 are in opposite states. However, at the second half of the clock cycle, i.e. after clock signal SYSCK goes low, latch 38 latches, thereby retaining the last value from latch 37. At this point, if the input signal to receiver 24a is at a logic state different from the logic state in the last clock cycle, the signal on lead 90 changes logic state by open latch 37 capturing the logic state of the signal on lead 83. Consequently, the signals on leads 88 and 90 are the same. Thus, feedback inverter 35 turns on to reduce the termination impedance, and to quickly dampen any signal reflections before the start of the next clock cycle. One of ordinary skill will appreciate that the present invention differs from the method disclosed in Davis (U.S. Pat. No. 4,450,370) referenced above at least in that Davis discloses a system which provides active termination in the first half of the clock cycle, and disables active termination in the second half of the clock cycle.

Although the specific embodiment described above shows only two feedback inverters or resistors 33 and 35, one can use multiple independently controlled inverters or resistors to create any resistance profile desired. Such resistance profile may be designed to be time-dependent, or voltage level-dependent, or both. In certain applications, especially in a system where a transmission line is driven and received by many transceivers, it may be advantageous to eliminate inverter 33, disabling active feedback until after a signal transition is completed on input lead 28 of receiver 24a.

Figure 4A:
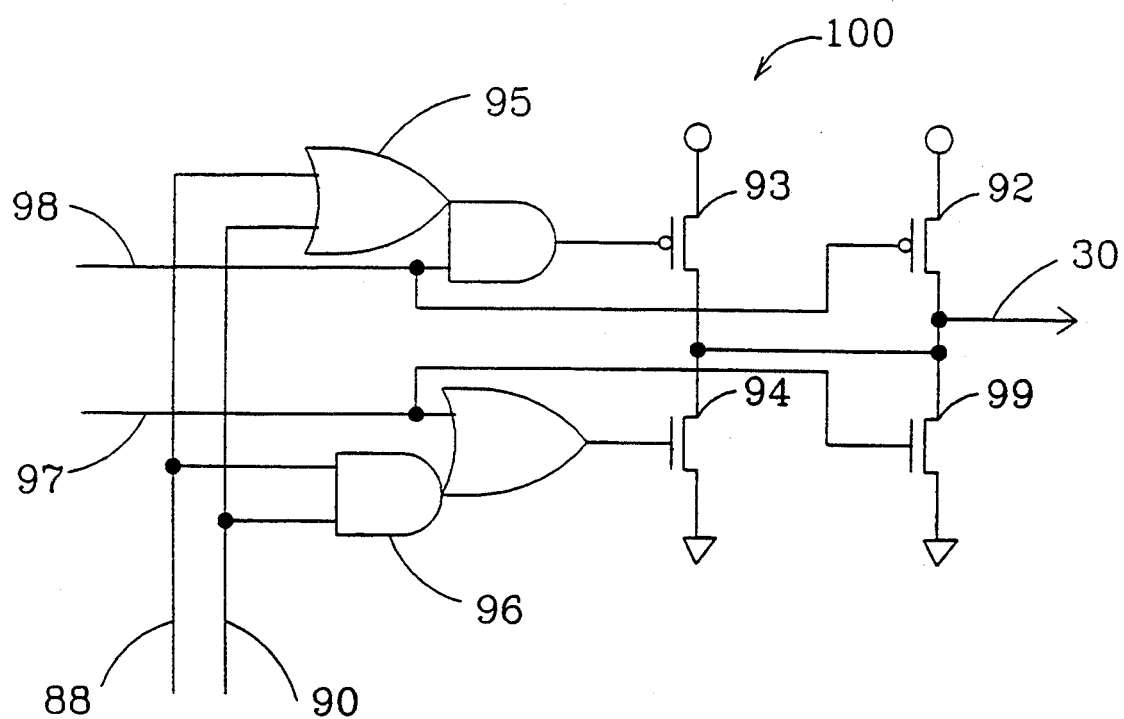
FIG. 4A is a schematic diagram which illustrates feedback inverter 35 of FIG. 4 being merged into an LTL output buffer 100, in accordance with the present invention.

To minimize chip area of the IC, inverter 35 can also be merged into the output structure of the driver portion of a bi-directional transceiver. FIG. 4A shows such an arrangement. As shown in FIG. 4A, output buffer 100 comprises two output stages formed by p-transistors 92 and 93, and n-transistors 94 and 99. Leads 88 and 90 are understood to be the same leads as the identically numbered leads of FIG. 4. When the signals on leads 88 and 90 are at the same polarity, under the circumstances described above, either transistor 93 or transistor 94 is turned on, according to whether the signals on leads 88 and 90 are both in the low or the high logic state.

The signals on input leads 97 and 98 are the normal IC output buffer tristate control signals, which are used to enable transistors 92, 93, 94 and 99. Considerable chip area savings can be realized by using transistors 93 and 94 as both input feedback and output buffer drivers.

Figure 5:
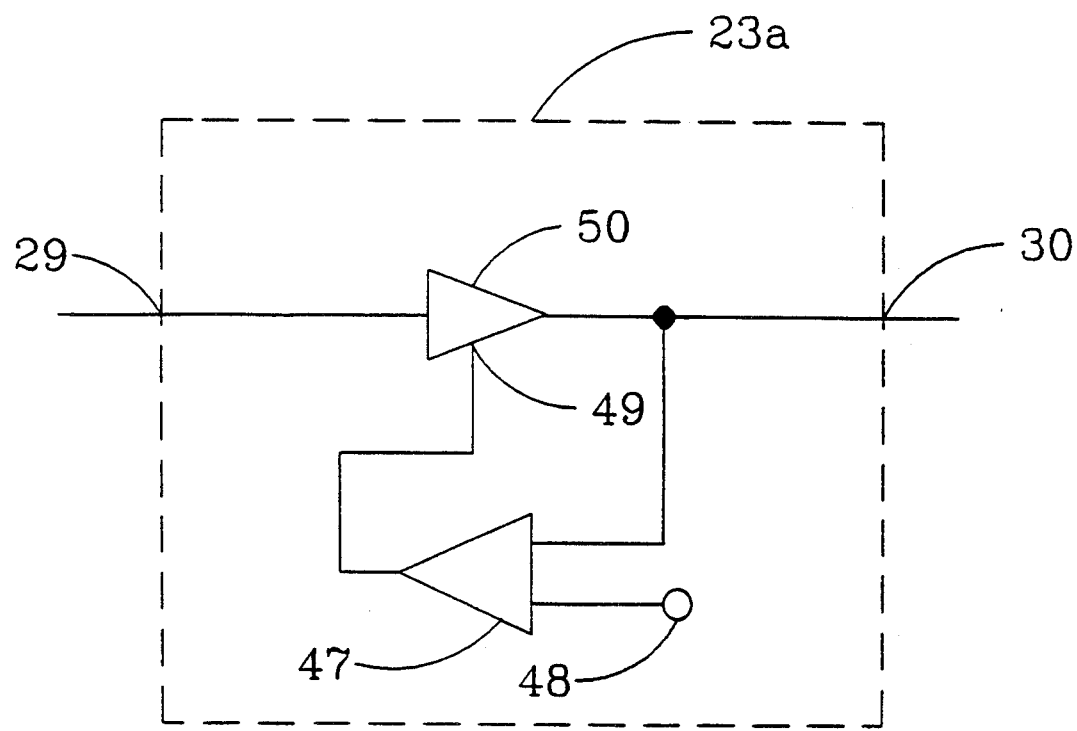
FIG. 5 is a block diagram of an LTL output buffer 23a of the present invention.

FIG. 5 is a block diagram of an LTL output driver 23a. In the LTL driver 23a of FIG. 5, the signal on lead 30, which is connected to transmission line 20 (see FIG. 3), is monitored and compared to reference signal 48 by a comparator or operational amplifier 47. The output signal of comparator 47 is used to drive a secondary input lead 49, which is used to control the gain of an output stage of buffer 50. During switching, the output impedance of buffer 50 gradually decreases to its minimum level, so that the signal on lead 30 may change state. Once the signal on lead 30 reaches a predetermined voltage level (i.e. the reference voltage on lead 48), comparator 47 increases the output impedance of buffer 50 via buffer 50's control input lead 49. This increase in buffer 50's output impedance, however, is designed such that buffer 50's output impedance does not fall below the value necessary to sustain the minimum required signal level at output lead 30. Thus, LTL driver 23a automatically balances buffer 50's output impedance to the characteristic impedance of transmission line 20. The voltage level on lead 30 is held steady until the expected transit time of the initial output signal over closed-loop transmission line 20 elapses. The expected transit time of the initial output signal is the time required for the initial output signal to return to the driver after travelling the length of the closed loop. Alternatively, in a conventional transmission line, the signal on lead 30 is maintained by driver 23a until after the expected time for the reflected signals to return. The returned or reflected signal, when superimposed on the signal level maintained on lead 30, completes the signal transition on the transmission line.

Driver 23a, by so adjusting its output impedance, achieves at least two benefits. First, regardless of variations in the manufacturing process, the signal on lead 30 is adequate to switch the receivers under "worst case" situations, without causing excessive signal overshoot under "best case" conditions. This scheme effectively increases output buffer impedance under "best case" conditions. Second, by increasing "best case" impedance and gradually reducing the gain of the LTL driver prior to full signal swing on the transmission line has occurred, the driver is effectively turned off in a slower and more controlled manner. Consequently, the output current of driver 23a is reduced more gradually, thereby avoiding the negative signal undershoot and oscillation phenomena commonly associated with a signal which is turned off rapidly.

Figure 6:
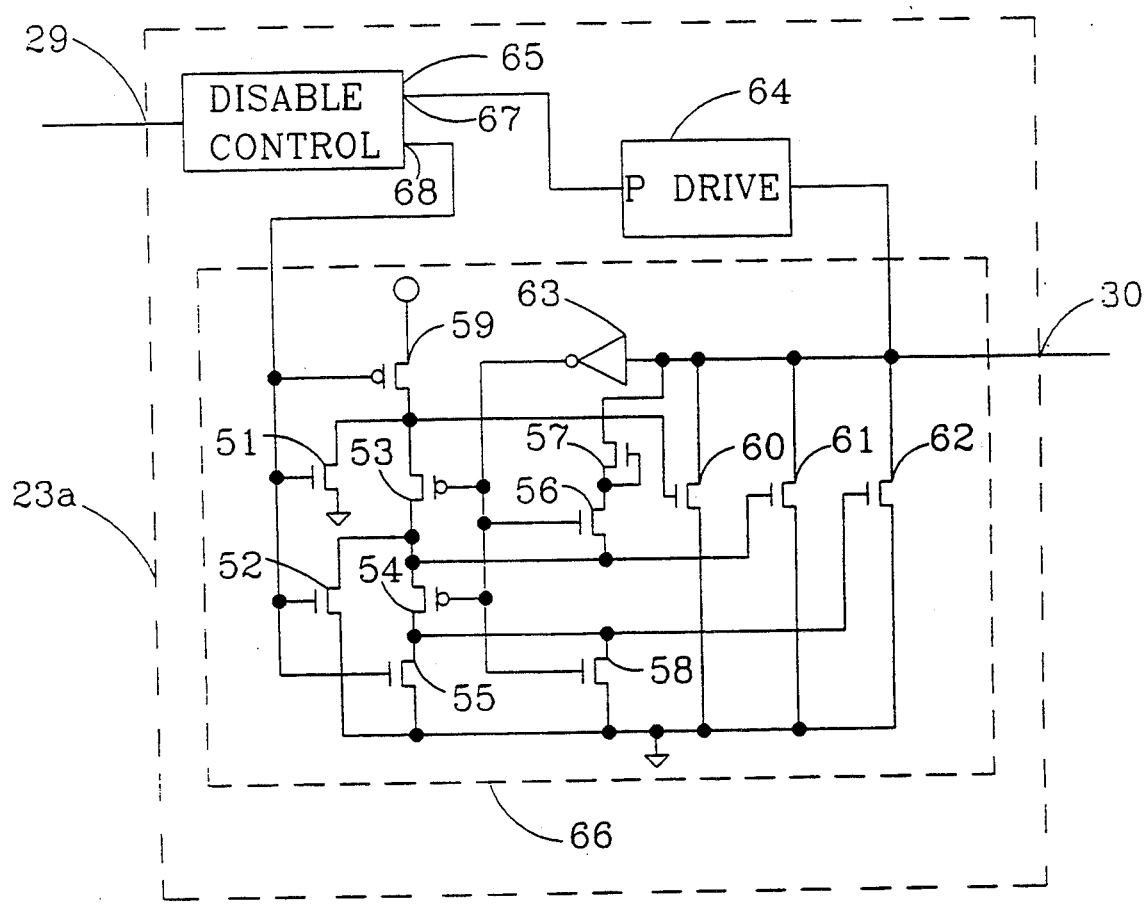
FIG. 6 is a schematic circuit of LTL output buffer 23a of the present invention.

FIG. 6 is a circuit schematic of LTL driver 23a. As shown in FIG. 6, a logic signal from the interior of the IC is received by disable control circuit 65 on primary input lead 29. Disable control circuit 65 may override this signal on lead 29 and completely turn off driver 23a. An output signal is provided on lead 67 to a P drive circuit 64, which provides a pullup drive to the output lead 30. P drive circuit 64, when enabled, brings the signal on output lead 30 to supply voltage. Another output signal of disable circuit 65 is provided on 68 to an N Drive circuit 66, which provides pulldown drive to the output lead 30. N drive circuit 66, when enabled, brings the signal on output lead 30 to ground voltage. Since disable control circuit 65 is conventional, the details of this circuit is omitted.

P Drive circuit 64 is similar but complementary to the circuitry in N drive circuit 66. That is, P drive circuit 64 can be derived from N drive circuit 66 by first replacing N drive circuit 66's P-channel and N-channel devices by N-channel and P-channel devices, respectively, and then connecting each power supply connections of the resulting circuit to the opposite power supply, i.e. sources of the P-channel devices to supply voltage and the sources of the N-channel devices to ground voltage. This procedure is known to one of ordinary skill and is therefore not further elaborated.

N Drive circuit 66 is a fully slew-controlled output buffer with multiple output N-channel transistors 60, 61, and 62. Transistors 60, 61 and 62 are turned on sequentially by P-channel transistors 59, 53, and 54, which act as resistive voltage dividers, so as to charge the gates of transistors 60, 61 and 62 at different rates. N-channel transistors 51, 52, and 55 turn off and discharge the gates of transistors 60, 61 and 62.

Together, transistors 60, 61, 62 provide a sufficiently low impedance under "worst case" conditions to properly drive transmission line 20, which may be connected directly to output lead 30. However, to prevent the impedance from becoming too low under conditions other than "worst case" conditions, regulation may be provided. This regulation function is performed by inverter 63 which functions as the comparator 47 described in conjunction with FIG. 5. Although reference signal 48, which is provided as an input signal to comparator 47 in FIG. 5, is not explicitly provided in inverter 63 of FIG. 6, the comparator function is provided in inverter 63, which is a conventional inverter designed such that its input threshold voltage level is equal to the minimum required output signal level of N drive circuit 66.

Initially, prior to an output transition by driver 23a to ground voltage, the output signal on lead 30 is at logic high, so that the output signal of inverter 63 is at logic low. Thus, under this condition, transistors 53 and 54 are on and transistors 56 and 58 are off. When the signal on lead 68 switches from logic high to logic low, transistor 59 turns on and transistors 51, 52, and 55 turn off, so that current flows through transistors 59, 53, and 54. As a result, the resistive dividers formed by transistor 59, 53 and 54 charge the gates of transistors 60, 61, and 62. As transistors 60, 61 and 62 turn on, due to the increasing voltage at their gate terminals, the voltage level of the output signal on lead 30 declines. When this voltage on lead 30 drops below the input threshold voltage level of inverter 63, the output signal of inverter 63 switches to logic high, thereby turning off transistors 53 and 54 and turning on transistors 56 and 58. Transistor 56, through diode-connected transistor 57, discharges the gate terminal of transistor 61 to transistor 61's drain terminal. Likewise, transistor 58 discharges transistor 62 to ground. Under the present scheme, if the voltage on lead 30 continues to decline, as when driving a large capacitive load, the output current on lead 30 declines sooner, in a very controlled manner and at a slower rate (i.e. a lower di/dt) than an uncontrolled driver. If driver 23a drives a transmission line, the output signal on lead 30 may rise slightly as the output impedance increases, thereby switching the output signal of inverter 63 logic low, charging the gates of transistors 62 and 63 until inverter 63 switches once again. By keeping the sizes of inverter 63 and transistors 56 and 58 relatively small, proper loop gain and phase margins are assured. Consequently, any oscillation is kept small and dampened completely over time. Such small oscillation does not affect proper operation of the system.

Diode-connected transistor 57 allows the gate voltage of transistor 61 to track one threshold voltage above its drain voltage as it turns off. Since current only flow in one direction in transistor 57, the gate terminal of transistor 61 cannot be charged by an output voltage on lead 30 being higher than the gate voltage of transistor 61. Thus, the present invention provides a method to assure a smooth turnoff without oscillation when driving larger capacitive loads.

The LTL system described above can be implemented in a CMOS interface using TTL or CMOS signal levels. If higher performance is desired, variable level input buffer can included in such interface, at the expense of some TTL compatibility. Note that each of the components can be used individually in conjunction with conventional circuitry, but the greatest benefits are reaped by a complete LTL implementation.

The above detailed description is provided to illustrate the specific embodiments of the present invention, and is not intended to be limiting. Numerous modifications and variations within the scope of the present invention are possible. The present invention is set forth in the following claims.

I claim:

1. A system receiving a clock signal, comprising:
    a transmission line;
    a plurality of input buffers having active input impedances selected to form distributed terminating resistances for said transmission line, said input buffers including an input buffer coupled to said clock signal and said transmission line, said input buffer receiving an input signal from said transmission line and setting an input threshold voltage level close to a voltage level of said input signal, after an initial phase of said clock signal; and
    a plurality of output buffers coupled to said transmission line for driving said input signal.

2. A system as in claim 1, wherein said output buffers include an output buffer having a variable output impedance.

3. A system as in claim 1, wherein said transmission line is connected end-to-end to form a closed loop.

4. A system as in claim 1, wherein said plurality of input buffers and said plurality of output buffers are equal in number, and wherein each such input buffers is associated with a corresponding one of said output buffers to form a transceiver.

5. A system as in claim 4, wherein said transmission line is connected end-to-end to form a closed loop, and wherein said transceivers are spaced on said closed-loop transmission line in roughly equal intervals.

6. A system as in claim 1, further comprising means connected to said output buffer for limiting an output signal from said output buffer to first and second intermediate voltage levels each having a value between a supply voltage and a ground voltage, said first and second intermediate voltage levels being selected as the terminating voltages of said terminating resistances.

7. A system as in claim 6, wherein the difference between said first and second intermediate voltage levels is in excess of the voltage swing of said output buffer.

8. A system as in claim 1, wherein said input buffer has an impedance which is higher during said initial phase of said clock signal than during a time period subsequent to said initial phase of said clock signal.

9. A system as in claim 8, wherein said impedance is variable only during a clock period of said clock signal when said input signal to said input buffer changes state.

10. A system as in claim 1, wherein one or more of said input buffers include means for achieving said active input impedances comprising feedback impedances and a control circuit for disabling said feedback impedances individually.

11. A system as in claim 10, wherein said means for achieving active input impedances further comprises means responsive to said input signal for detecting a logic state transition in said input signal, and for enabling said control circuit in response to said logic state transition detected.

12. A system as in claim 10, wherein said feedback impedances each comprise an inverter sized to provide a desired impedance.

13. A system as in claim 11, further comprising means for delaying said input signal by said initial phase of said clock signal, said initial phase of said clock signal being approximately one half of a period of said clock signal.

14. A system as in claim 13, wherein said means for delaying said input signal comprises two latches clocked by opposite phase of said clock signal.

15. A system as in claim 10, wherein one or more of said input buffers each associate with a corresponding one of said output buffers to form a transceiver, and wherein said feedback impedances in said one or more input buffers are provided in said corresponding one of said output buffers.

16. A system as in claim 15, wherein said output buffer of said transceivers each comprise:
    a first buffer for providing an output signal;
    a second buffer sized for providing a desired feedback impedance; and
    an enabling circuit receiving one or more control signals from said control circuit, said enabling circuit enabling said first and second buffers when said transceiver is designated for providing said output signal, and enabling said second buffer when said transceiver is designated for providing said desired feedback impedance.

17. A system as in claim 6, wherein the difference between said first and second intermediate voltages is less than the output voltage swing of said output buffer, and said system further comprising means for disabling said output buffer prior to a new cycle of said clock signal, so as to allow said transmission line to attain one of said terminating voltages.

18. A system as in claim 1, wherein said input buffer comprises an impedance to provide input hysteresis.

19. A variable impedance input buffer receiving an input signal, said input signal having first and second logic states, comprising:
- an input buffer receiving said input signal for providing an output signal;
- first means coupled to said input buffer for coupling said input signal to a first supply voltage when said input signal is in said first logic state, said first means for coupling providing said input signal a first impedance path to said first supply voltage during said initial phase of said clock signal, and providing said input signal a second impedance path to said first supply voltage after said initial phase of said clock signal, said first impedance path to said first supply voltage having an impedance larger than said second impedance path to said first supply voltage; and
- second means coupled to said input signal for coupling said input signal to a second supply voltage when said input signal is in said second logic state, said second means for coupling providing said input signal a first impedance path to said second supply voltage during said initial phase of said clock signal, and providing said input signal a second impedance path to said second supply voltage after said initial phase of said clock signal, said first impedance path to said second supply voltage having an impedance larger than said second impedance path to said second supply voltage.

20. A variable impedance input buffer as in claim 19, wherein first and second impedance paths to each supply voltage comprise respectively first and second transistors sized such that the on-impedance of said first transistor exceeds the on-impedance of said second transistor.

21. A variable impedance output buffer receiving an input signal and providing an output signal, comprising:
- an output buffer receiving said input signal to provide said output signal at an output terminal, said output buffer including means responsive to one or more gain adjustment signals for adjusting the gain of said output buffer; and
- means receiving said output signal for providing said one or more gain adjustment signals, said means for providing said gain adjustment signal provides said gain adjustment signals in a manner such that said gain of said output buffer decreases until a predetermined minimum gain is reached, and maintaining said gain of said output buffer thereafter so as to maintain said output signal at a predetermined voltage level.

22. A variable impedance output buffer as in claim 21, wherein said means for adjusting the gain of said output buffer comprises:
- a plurality of parallel transistors each providing a corresponding predetermined impedance between said output terminal and a supply voltage source; and
- means receiving said one or more gain adjustment signals for enabling selected ones of said plurality of parallel transistors in accordance with said gain adjustment signals.

23. A variable impedance output buffer as in claim 22, wherein said means for enabling selected ones of said plurality of parallel transistors includes means for discharging a transistor through a drain terminal of said transistor, said drain terminal of said transistor being coupled to said output terminal.

24. A variable impedance output buffer as in claim 23, wherein said means for discharging a transistor connects a gate of said transistor to said drain terminal of said transistor through a diode-connected transistor.

25. A variable impedance output buffer as in claim 22, wherein said means for providing said one or more gain adjustment signals provides said gain adjustment signals such that said plurality of parallel transistor are enabled in a predetermined sequence.

26. A method for interfacing CMOS circuits, comprising the steps of:
- providing a transmission line;
- providing a clock signal;
- providing a plurality of input buffers, said plurality of input buffers having active input impedances selected to form distributed terminating resistances for said transmission line, said input buffers including an input buffer coupled to receive said clock signal and an input signal from said transmission line, said input buffer setting an input threshold voltage level close to a voltage level of said input signal, after an initial phase of said clock signal; and
- providing a plurality of output buffers coupled to said transmission line for driving said input signal.

27. A method as in claim 26, wherein said step of providing a plurality of output buffers provides an output buffer having a variable output impedance.

28. A method as in claim 26, wherein said step of providing a transmission line connects said transmission line end-to-end to form a closed loop.

29. A method as in claim 26, wherein said steps of providing a plurality of input buffers and a plurality of output buffers provides equal number of input and output buffers, and wherein each such input buffers is associated with a corresponding one of said output buffers to form a transceiver.

30. A method as in claim 29, wherein said step of providing a transmission line is connected end-to-end to form a closed loop, and wherein said transceivers are spaced on said closed-loop transmission line in roughly equal intervals.

31. A method as in claim 26, further comprising the step of connecting said output buffer so as to limit an output signal from said output buffer to first and second intermediate voltage levels each having a value between a supply voltage and a ground voltage, said first and second intermediate voltage levels being selected as the terminating voltages of said terminating resistances.

32. A method as in claim 31, wherein the difference between said first and second intermediate voltage levels is in excess of the voltage swing of said output buffer.

33. A method as in claim 26, wherein said input buffer has an impedance which is higher during said initial phase of said clock signal than during a time period subsequent to said initial phase of said clock signal.

34. A method as in claim 33, wherein said impedance is variable only during a clock period of said clock signal when said input signal to said input buffer changes state.

35. A method as in claim 26, wherein said step of providing input buffers achieves said active input impedances by including the step of providing feedback impedances and the step of providing a control circuit for disabling said feedback impedances individually.

36. A method as in claim 35, further comprising the step of detecting in response to said input signal a logic state transition in said input signal, said logic state transition detected enabling said control circuit.

37. A method as in claim 35, wherein said step of providing feedback impedances provides for each feedback impedance an inverter sized to provide a desired impedance.

38. A method as in claim 36, further comprising the step of delaying said input signal by said initial phase of said clock signal, said initial phase of said clock signal being approximately one half of a period of said clock signal.

39. A method as in claim 38, wherein said step of delaying said input signal provides two latches clocked by opposite phase of said clock signal.

40. A method as in claim 35, wherein said step of providing said input buffers provides one or more input buffers each associated with a corresponding one of said output buffers to form a transceiver, and wherein said feedback impedances in said one or more input buffers are provided in said corresponding one of said output buffers.

41. A method as in claim 40, wherein said output buffer of said transceivers are each provided by a second method comprising the steps of:
providing a first buffer to generate an output signal;
providing a second buffer sized to have a desired feedback impedance; and
providing an enabling circuit receiving one or more control signals from said control circuit, said enabling circuit enabling said first and second buffers when said transceiver is designated for providing said output signal, and enabling said second buffer when said transceiver is designated for providing said desired feedback impedance.

42. A method as in claim 31, wherein the difference between said first and second intermediate voltages is less than the output voltage swing of said output buffer, and said method further comprising the step of disabling said output buffer prior to a new cycle of said clock signal, so as to allow said transmission line to attain one of said terminating voltages.

43. A method as in claim 26, wherein said input buffer is provided an impedance to effectuate input hysteresis.

44. A method for providing a variable impedance input buffer receiving an input signal, said input signal having first and second logic states, said method comprising:
providing an input buffer receiving said input signal to generate an output signal;
coupling said input buffer to a first supply voltage when said input signal is in said first logic state, said step of coupling said input buffer providing said input signal a first impedance path to said first supply voltage during said initial phase of said clock signal, and providing said input signal a second impedance path to said first supply voltage after said initial phase of said clock signal, said first impedance path to said first supply voltage having an impedance larger than said second impedance path to said first supply voltage; and
coupling said input buffer to a second supply voltage when said input signal is in said second logic state, said step of coupling said input buffer to a second supply voltage providing said input signal a first impedance path to said second supply voltage during said initial phase of said clock signal, and providing said input signal a second impedance path to said second supply voltage after said initial phase of said clock signal, said first impedance path to said second supply voltage having an impedance larger than said second impedance path to said second supply voltage.

45. A method as in claim 44, wherein steps of providing said input signal first and second impedance paths to each supply voltage comprise respectively the steps of providing first and second transistors sized such that the on-impedance of said first transistor exceeds the on-impedance of said second transistor.

46. A method for providing variable impedance output buffer receiving an input signal and providing an output signal, said method comprising:
providing an output buffer receiving said input signal to generate said output signal at an output terminal, including the steps of (a) providing a plurality of parallel transistors each having a corresponding predetermined impedance between said output terminal and a supply voltage source, and (b) enabling selected ones of said plurality of parallel transistors in accordance with one or more gain adjustment signals; and
providing said one or more gain adjustment signals, such that the impedance of said output buffer decreases until a predetermined minimum gain is reached, and maintaining said gain of said output buffer thereafter so as to maintain said output signal at a predetermined voltage level;
wherein said step for enabling selected ones of said plurality of parallel transistor includes the step of discharging a transistor through a drain terminal of said transistor, said drain terminal of said transistor being coupled to said output terminal.

47. A method for providing a variable impedance output buffer receiving an input signal and providing an output signal, said method comprising:
providing an output buffer receiving said input signal to generate said output signal at an output terminal, including the steps of (a) providing a plurality of parallel transistors each having a corresponding predetermined impedance between said output terminal and a supply voltage source, and (b) enabling selected ones of said plurality of parallel transistors in accordance with one or more gain adjustment signals; and
providing said one or more gain adjustment signals, such that the impedance of said output buffer decreases until a predetermined minimum gain is reached, and maintaining said gain of said output buffer thereafter so as to maintain said output signal at a predetermined voltage level;
wherein said step of discharging a transistor includes the step of connecting a gate of said transistor to said drain terminal of said transistor through a diode-connected transistor.

* * * * *